(12) United States Patent
Park et al.

(10) Patent No.: US 10,062,864 B2
(45) Date of Patent: Aug. 28, 2018

(54) ORGANIC LIGHT EMITTING DISPLAY PANEL AND METHOD OF MANUFACTURING THE SAME

(71) Applicant: LG DISPLAY CO., LTD., Seoul (KR)

(72) Inventors: Joon Won Park, Seoul (KR); Jae Young Lee, Paju-si (KR); Tae-Kyung Kim, Yeosu-si (KR); Sangheun Lee, Seoul (KR); Hae Ri Huh, Goyang-si (KR); Hun Hoe Heo, Daejeon (KR); Ji-Min Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/721,698

(22) Filed: May 26, 2015

(65) Prior Publication Data

US 2015/0349293 A1 Dec. 3, 2015

(30) Foreign Application Priority Data

May 27, 2014 (KR) ........................ 10-2014-0063963

(51) Int. Cl.
*H01L 27/32* (2006.01)
*H01L 51/52* (2006.01)

(52) U.S. Cl.
CPC ...... *H01L 51/5253* (2013.01); *H01L 27/3246* (2013.01); *H01L 27/3258* (2013.01); *H01L 51/524* (2013.01); *H01L 51/5221* (2013.01); *H01L 51/5237* (2013.01)

(58) Field of Classification Search
CPC ...................................................... H01L 27/32
See application file for complete search history.

(56) References Cited

U.S. PATENT DOCUMENTS

| | | | |
|---|---|---|---|
| 2002/0068143 A1* | 6/2002 | Silvernail | B32B 3/00 428/76 |
| 2003/0201443 A1 | 10/2003 | Yamagata et al. | |
| 2003/0227019 A1 | 12/2003 | Kim et al. | |
| 2006/0028133 A1* | 2/2006 | Kondo | H05B 33/04 313/512 |
| 2006/0132033 A1* | 6/2006 | Maeda | H01L 51/56 313/512 |
| 2006/0183394 A1 | 8/2006 | Kim et al. | |
| 2007/0170455 A1* | 7/2007 | Choi | H01L 51/5246 257/100 |
| 2008/0122354 A1* | 5/2008 | Ahn | H01L 51/524 313/506 |

(Continued)

FOREIGN PATENT DOCUMENTS

| | | |
|---|---|---|
| CN | 1278660 A | 1/2001 |
| CN | 1469424 A | 1/2004 |

(Continued)

*Primary Examiner* — Joseph C Nicely
*Assistant Examiner* — Lamont Koo
(74) *Attorney, Agent, or Firm* — Birch, Stewart, Kolach & Birch, LLP (57) ABSTRACT

An apparatus can include a first electrode on a planarization layer, an organic emission layer on the first electrode, a first bank and a second bank on the planarization layer and configured to surround the organic emission layer, and an anti-moisture unit on a portion of the planarization layer and a portion of the second bank, wherein the anti-moisture unit is configured to suppress moisture permeation through the second bank and the planarization layer.

20 Claims, 8 Drawing Sheets

(56) References Cited

U.S. PATENT DOCUMENTS

| | | | |
|---|---|---|---|
| 2009/0021154 A1* | 1/2009 | Aota | H01L 27/3258 313/504 |
| 2009/0289549 A1* | 11/2009 | Lee | H01L 51/5256 313/553 |
| 2010/0171138 A1 | 7/2010 | Yamazaki et al. | |
| 2011/0210957 A1* | 9/2011 | Koyama | G06F 1/3218 345/212 |
| 2011/0266590 A1* | 11/2011 | Heuser | H01L 51/5253 257/100 |
| 2012/0319572 A1* | 12/2012 | Lee | H01L 51/524 313/512 |
| 2013/0049003 A1* | 2/2013 | Choi | H01L 51/5246 257/72 |
| 2013/0082592 A1* | 4/2013 | Song | H01L 51/5246 313/504 |
| 2015/0194631 A1 | 7/2015 | Yamazaki et al. | |

FOREIGN PATENT DOCUMENTS

| | | |
|---|---|---|
| CN | 1828839 A | 9/2006 |
| JP | 2004-234901 A | 8/2004 |
| JP | 4497156 B2 | 7/2010 |

\* cited by examiner

ORGANIC LIGHT EMITTING DISPLAY PANEL AND METHOD OF MANUFACTURING THE SAME

CROSS-REFERENCE TO RELATED APPLICATIONS

This application claims the priority benefit of the Korean Patent Application No. 10-2014-0063963 filed on May 27, 2014, which is hereby incorporated by reference as if fully set forth herein.

BACKGROUND

Field of the Invention

The present disclosure relates to an organic light emitting display panel and a method of manufacturing the same, and more particularly, to an organic light emitting display panel and a method of manufacturing the same, which use face seal technology for achieving narrow bezel configurations.

Discussion of the Related Art

Recently, flat panel displays (FPD) and other types of display apparatuses which have good characteristics such as thinness, lightness, and low power consumption are increasing in importance. Examples of display apparatuses include liquid crystal display (LCD) apparatuses, plasma display panels (PDPs), organic light emitting display (OLED) apparatuses, flexible displays, curved displays, etc. Recently, electrophoretic display (EPD) apparatuses are being used as well.

In particular, LCD apparatuses and organic light emitting display apparatuses including thin film transistors (TFTs) provide good results in resolution, color display, and image quality, and thus are commercialized as display apparatuses for notebook computers, tablet computers, desktop computers, smartphones, and various other electronic devices.

Organic light emitting display (OLED) apparatuses are self-emitting apparatuses, and have low power consumption, a fast response time, high emission efficiency, high luminance, and a wide viewing angle. Therefore, the organic light emitting display apparatuses are attracting much attention as the next-generation display apparatuses.

Generally, the lifetime of a panel for an organic light emitting display apparatus is determined based on certain factors, such as an operation lifetime and a shelf lifetime.

The operation lifetime denotes a period where the maximum luminance is reduced when driving a device (for example, an organic light emitting diode (OLED)). The operation lifetime can be determined based on impurities contained in an organic material, an interface between the organic material and an electrode, a low glass transition temperature (Tg) of the organic material, and oxidization of a device (for example, an OLED) by oxygen and moisture.

The shelf lifetime denotes a period during which characteristics of an emission area is gradually reduced by moisture permeation into the organic material despite the device not being driven.

The lifetime of an OLED is determined by a shorter lifetime value among the operation lifetime and the shelf lifetime.

Moisture denotes that which is introduced in a process of manufacturing a device (for example, an OLED), and moisture which permeates from the exterior into the manufactured device. In some organic light emitting display apparatuses, face seal technology is used for minimizing the permeation of external moisture.

Figure 1:
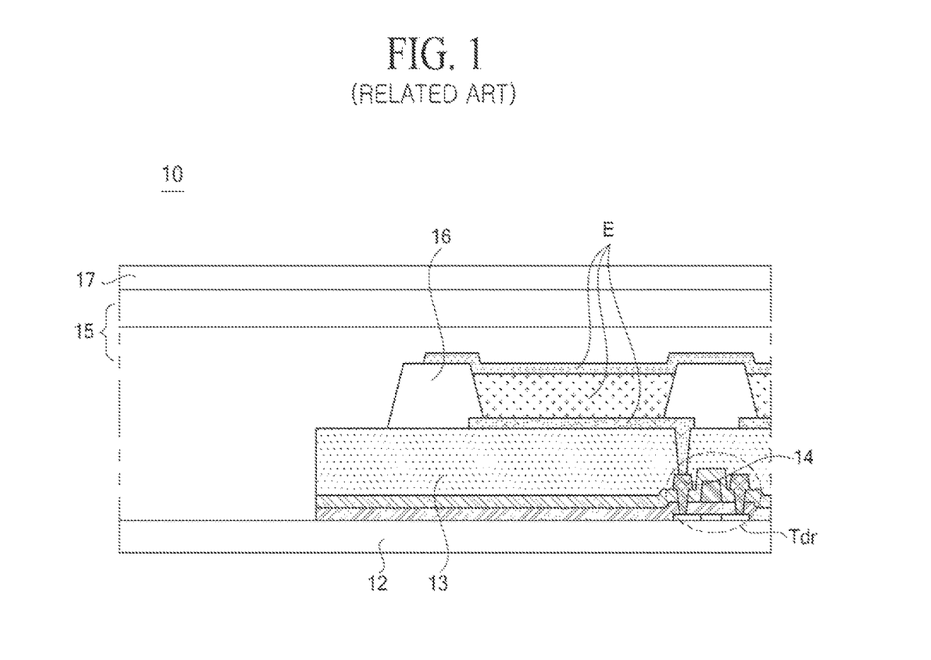
FIG. 1 is a cross-sectional view schematically illustrating a configuration of an organic light emitting display panel having a face seal structure according to a related art.
Figure 2A:
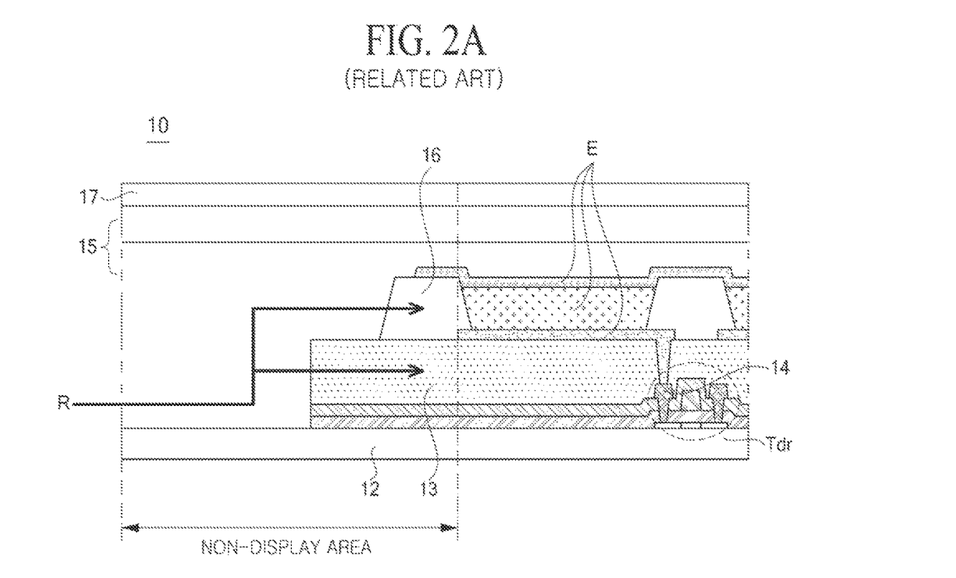
FIGS. 2A and 2B are exemplary diagrams for describing a moisture permeation path based on a non-display area size in the organic light emitting display panel having the face seal structure according to the related art.
Figure 2B:
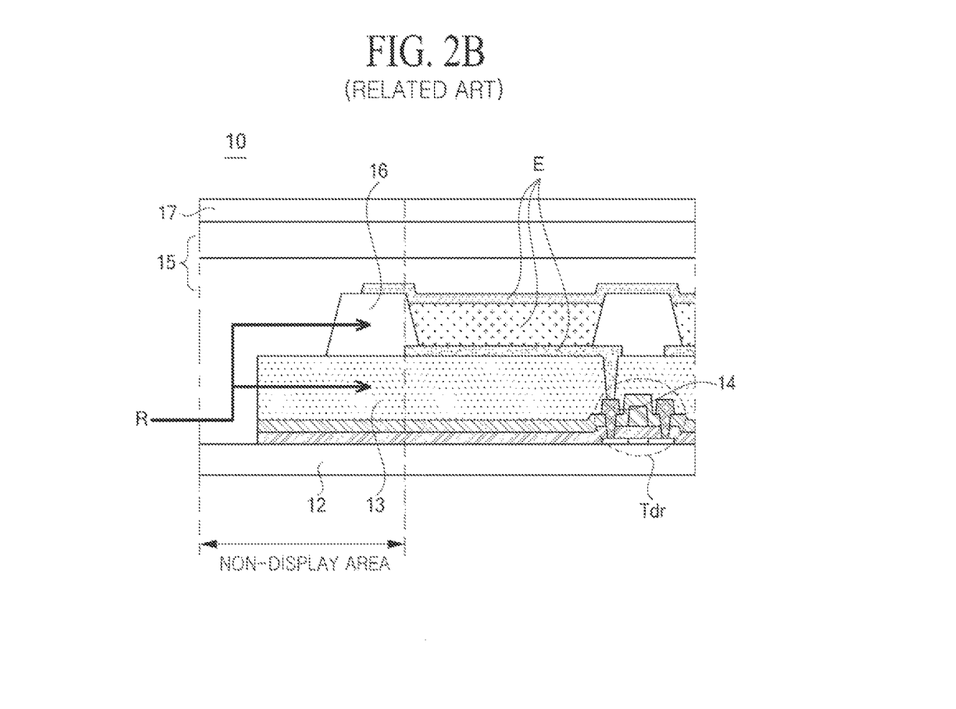

FIG. 1 is a cross-sectional view schematically illustrating a configuration of an organic light emitting display panel 10 having a face seal structure according to a related art. FIGS. 2A and 2B are exemplary diagrams for describing a moisture permeation path based on a non-display area size in the organic light emitting display panel 10 having the face seal structure. The non-display area includes a bezel area.

Referring to FIG. 1, the organic light emitting display panel 10 includes a driving transistor Tdr which is on a first substrate 12, an OLED (denoted as "E") which is connected to a first driving electrode 14 of the driving transistor Tdr, a passivation layer 15 which covers the entire surface of the first substrate 12 including the OLED E, and a second substrate 17 which is provided on the passivation layer 15. In this case, the first substrate 12 is closely adhered to the second substrate 17 with the passivation layer 15 therebetween. In such organic light emitting display apparatus, the passivation layer 15 and the second substrate 17 cover the entire upper surface of the first substrate 12, and thus, even when external force or impact is applied to the organic light emitting display apparatus, the organic light emitting display panel 10 is not easily damaged.

However, in such organic light emitting display apparatus having the face seal structure, a moisture permeation path could occur due to interface imperfections or defects of a non-display area including a bezel area. In this case, as illustrated in FIG. 2A, moisture permeates into the OLED E via a bank 16 and a planarization layer 13, which are disposed at an outermost portion of the organic light emitting display panel 10, along a moisture permeation path R which starts from a side surface of the passivation layer 15.

Particularly, in a case of implementing a narrow bezel in an organic light emitting display apparatus, since an anti-moisture film such as a barrier film is not provided in a non-display area, allowing for a moisture permeation path up to a certain length or distance should be secured for maximally delaying the permeation of external moisture.

However, as illustrated in FIG. 2B, in the organic light emitting display apparatus having the face seal structure, as the non-display area is reduced, the moisture permeation path R becomes shorter.

Therefore, a probability that moisture permeates into the OLED E via the bank 16 and the planarization layer 13 which are disposed at the outermost portion of the organic light emitting display panel 10 becomes higher.

Due to the permeation of moisture, a moisture permeability of the OLED E can worsen, and a lifetime of the OLED (E) is shortened. For this reason, the lifetime of the organic light emitting display apparatus according to the related art is shortened.

SUMMARY OF THE INVENTION

Accordingly, the present disclosure is directed to provide an organic light emitting display panel and a method of manufacturing the same that substantially obviate one or more problems due to limitations and disadvantages explained above.

An aspect of the present disclosure is directed to provide an organic light emitting display panel which includes an anti-moisture unit formed on a planarization layer so as to cover a non-display area and a second bank disposed between the non-display area and a display area.

Additional advantages and features of the present disclosure will be set forth in part in the description which follows and in part will become apparent to those having ordinary skill in the art upon examination of the following or may be learned from practice of the present disclosure. The objectives and other advantages of the present disclosure may be realized and attained by the structure particularly pointed out in the written description and claims hereof as well as the appended drawings.

To achieve these and other advantages and in accordance with the purpose of the present disclosure, as embodied and broadly described herein, there is provided an organic light emitting display panel which can include: a first substrate; a plurality of driving transistors formed on the first substrate; a planarization layer configured to cover the plurality of driving transistors; a first bank formed on the planarization layer and in a display area where the plurality of driving transistors are formed, and configured to divide a plurality of pixels; a second bank formed on the planarization layer and configured to divide the display area and a non-display area disposed outside the display area; an anti-moisture unit formed on the planarization layer to cover the non-display area and the second bank; a plurality of organic light emitting diodes (OLEDs) respectively formed in the plurality of pixels and configured to emit light by the respective driving transistors; a passivation layer formed on the anti-moisture unit and the plurality of OLEDs; and a second substrate configured to cover the passivation layer.

It is to be understood that both the foregoing general description and the following detailed description of the present disclosure are exemplary and explanatory and are intended to provide further explanation of the present disclosure as claimed.

BRIEF DESCRIPTION OF THE DRAWINGS

The accompanying drawings, which are included to provide a further understanding of the present disclosure and are incorporated in and constitute a part of this disclosure, illustrate embodiments of the present disclosure and together with the description serve to explain the principle of the present disclosure. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings.

Figure 3:
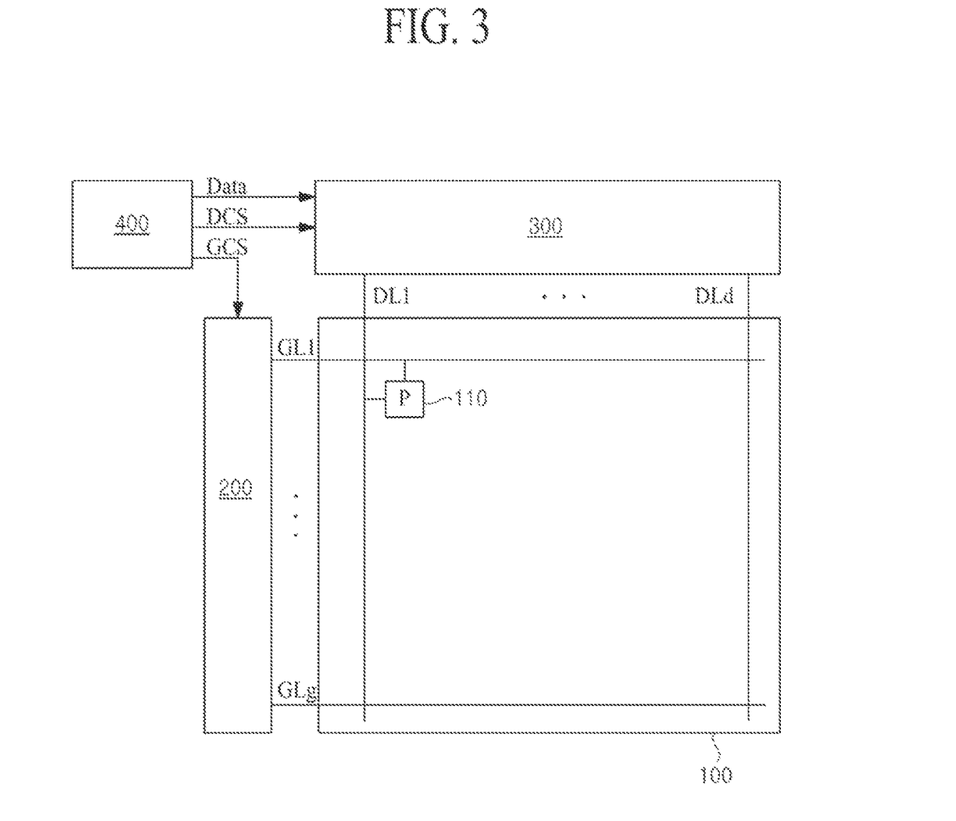
FIG. 3 is an exemplary diagram illustrating a configuration of an organic light emitting display apparatus including an organic light emitting display panel according to an exemplary embodiment of the present invention.

FIG. 3 is an exemplary diagram illustrating a configuration of an organic light emitting display apparatus including an organic light emitting display panel according to an exemplary embodiment of the present disclosure.

As illustrated in FIG. 3, the organic light emitting display apparatus including the organic light emitting display panel according to an exemplary embodiment of the present disclosure includes: a panel 100 where a plurality of pixels (P) 110 are respectively provided at or near intersection areas of a plurality of gate lines GL1 to GLg and a plurality of data lines DL1 to DLd; a gate driver 200 that sequentially supplies a scan pulse to the gate lines GL1 to GLd formed in the panel 100; a data driver 300 that respectively supplies data voltages to the data lines DL1 to DLd formed in the panel 100; and a timing controller 400 that controls a function of the gate driver 200 and a function of the data driver 300. All the components of the organic light emitting apparatus in this and other embodiments are operatively coupled and configured.

In the panel 100, the plurality of pixels (P) 110 may be respectively provided in a plurality of areas defined by intersections of the plurality of gate lines GL and the plurality of data lines DL.

Each of the plurality of pixels 110 may include an organic light emitting diode (OLED), which emits light, and a driver that drives the OLED.

First, the OLED may be configured in a top emission type where the light emitted from the OLED passes through an upper substrate, or may be configured in a bottom emission type where the light emitted from the OLED passes through a lower substrate.

Second, the driver may be connected to a data line DL and a gate line GL which correspond to the driver. The driver may include a driving transistor, a switching transistor, and a storage capacitor, which are used to drive the OLED.

An anode of the OLED may be connected to a first power source, and a cathode of the OLED may be connected to a second power source. The OLED may emit light having certain luminance in response to a current supplied from the driving transistor.

When the scan pulse is supplied through the gate line GL, the driver may control an amount of current supplied to the OLED according to a data voltage supplied through the data line DL.

To this end, the driving transistor may be connected between the first power source and the OLED, and the switching transistor may be connected to the driving transistor, the data line DL, and the gate line GL.

The timing controller 400 outputs a gate control signal GCS for controlling the gate driver 200 and a data control signal DCS for controlling the data driver 300 by using a vertical sync signal, a horizontal sync signal, and a clock which are supplied from an external system.

The timing controller 400 samples input image data received from the external system, realigns the sampled image data, and supplies realigned digital image data to the data driver 300.

That is, the timing controller 400 realigns the input image data supplied from the external system, and supplies the realigned digital image data to the data driver 300. Also, the timing controller 400 generates the gate control signal GCS for controlling the gate driver 200 and the data control signal DCS for controlling the data driver 300 by using the vertical sync signal, the horizontal sync signal, and the clock signal which are supplied from the external system, and respectively transfers the gate control signal GCS and the data control signal DCS to the gate driver 200 and the data driver 300. Here, the vertical sync signal, the horizontal sync signal, and the clock signal are simply referred to as timing signals.

To this end, particularly, the timing controller 400 includes: a receiver that receives the input image data and the signals from the external system; an image data processor that realigns the input image data received from the receiver so as to match the panel 100, and generates the realigned digital image data; a control signal generator that generates the gate control signal GCS for controlling the gate driver 200 and the data control signal DCS for controlling the data driver 300 by using the signals received from the receiver; and a transferor that respectively outputs the control signals, generated by the control signal generator, to the gate driver 200 and the data driver 300, and outputs the image data, generated by the image data processor, to the data driver 300.

The data driver 300 converts the image data, input from the timing controller 400, into analog data voltages, and respectively supplies data voltages of one horizontal line to the data lines at every one horizontal period where the scan pulse is supplied to a corresponding gate line. That is, the data driver 300 converts the image data into the data voltages by using gamma voltages supplied from a gamma voltage generator, and respectively outputs the data voltages to the data lines.

That is, the data driver 300 shifts a source start pulse SSP from the timing controller 400 according to a source shift clock SSC to generate a sampling signal. The data driver 300 latches the image data, input according to the source shift clock SSC, according to the sampling signal, and converts the image data into the data voltages. Then, the data driver 300 respectively supplies the data voltages to the data lines in units of a horizontal line in response to a source output enable signal SOE.

To this end, the data driver 300 may include a shift register, a latch, a digital-to-analog converter (DAC), and an output buffer.

The shift register outputs the sampling signal by using data control signals received from the timing controller 400.

The latch latches the digital image data which are sequentially received from the timing controller 400, and then simultaneously outputs the latched image data to the DAC.

The DAC converts the image data, transferred from the latch, into the data voltages, and outputs the data voltages. That is, the DAC converts the image data into the data voltages by using the gamma voltages supplied from the gamma voltage generator, and respectively outputs the data voltages to the data lines.

The output buffer respectively outputs the data voltages, transferred from the DAC, to the data lines DL of the panel 100 according to the source output enable signal SOE transferred from the timing controller 400.

The gate driver 200 sequentially supplies the scan pulse to the gate lines GL1 to GLg of the panel 100 in response to the gate control signal input from the timing controller 400. Therefore, a plurality of switching transistors which are respectively formed in a plurality of sub-pixels 110 on a corresponding horizontal line to which the scan pulse is applied are turned on, and an image may be output to each of the sub-pixels 110.

That is, the gate driver 200 shifts a gate start pulse GSP transferred from the timing controller 400 according to a gate shift clock GSC to sequentially supply the scan pulse having a gate-on voltage to the gate lines GL1 to GLg. Also, during the other period where the scan pulse is not supplied, the gate driver 200 supplies a gate-off voltage to the gate lines GL1 to GLg.

The gate driver 200 may be provided independently from the panel 100, and may be configured in a type which is electrically connected to the panel 100 by various manners. However, the gate driver 200 may be configured in a gate-in-panel (GIP) type which is equipped in the panel 100. In this case, a gate control signal for controlling the gate driver 200 may include a start signal VST and a gate clock GCLK.

Moreover, hereinabove, it has been described that the data driver 300, the gate driver 200, and the timing controller 400 are separately provided, but at least one among the data driver 300 and the gate driver 200 may be provided as one body with the timing controller 400. Hereinafter, also, a generic name for the gate driver 200, the data driver 300, and the timing controller 400 is a panel driver.

Figure 4:
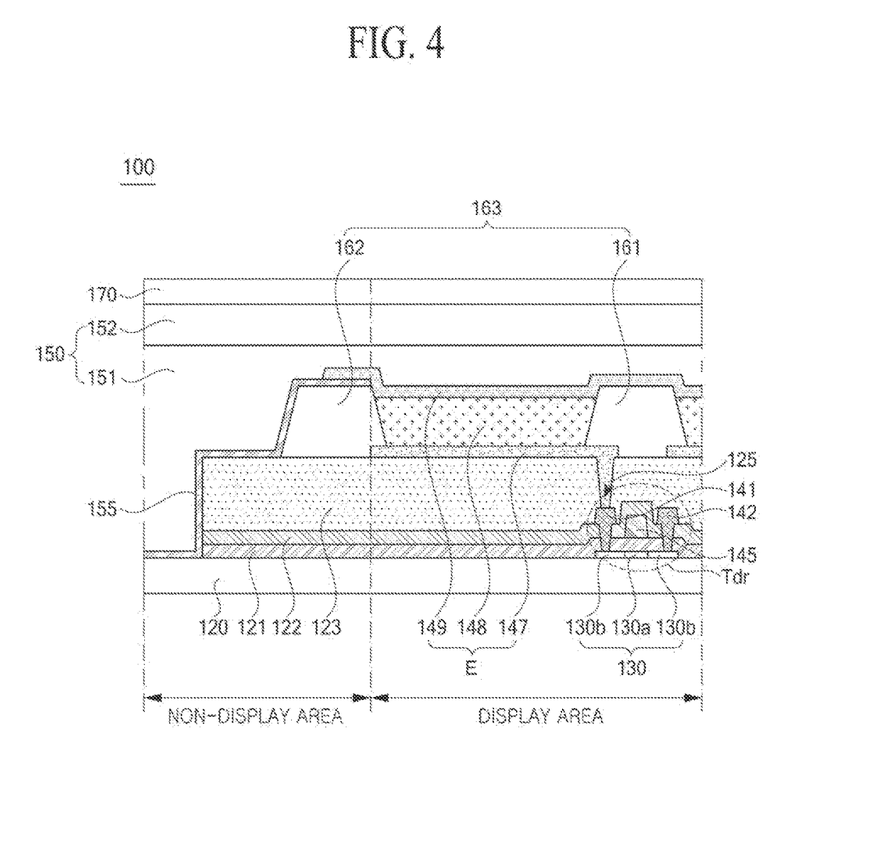
FIG. 4 is an exemplary diagram for describing an organic light emitting display panel according to an exemplary embodiment of the present invention.

FIG. 4 is an exemplary diagram for describing an organic light emitting display panel 100 according to an exemplary embodiment of the present disclosure.

As illustrated in FIG. 4, the organic light emitting display panel 100 includes a first substrate 120, a plurality of driving transistors Tdr which are formed on the first substrate 120, a planarization layer 123 which covers the driving transistors Tdr, a first bank 161 which is formed on the planarization layer 123 and in a display area where the driving transistors Tdr are formed and divides a plurality of pixels, a second bank 162 which is formed on the planarization layer 123 and divides the display area and a non-display area which is disposed outside the display area, an anti-moisture unit 155 which is formed on the planarization layer 123 to cover the non-display area and the second bank 162, a plurality of OLEDs E which are respectively formed in the plurality of pixels and emit light by the respective driving transistors Tdr, a passivation layer 150 which is formed on the anti-moisture unit 155 and the OLEDs E, and a second substrate 170 which covers the passivation layer 150.

A semiconductor layer 130 which is divided into a first area 130a including pure polysilicon and two second areas 130b on which impurities are doped, a gate insulation layer 121, a gate 145, an interlayer dielectric 122, and a driving thin film transistor (hereinafter referred to as a driving transistor) Tdr including first and second driving electrodes 141 and 142 may be formed on the first substrate 120. Here, the first driving electrode 141 may be connected to one of the two second areas 130b of the semiconductor layer 130, and the second driving electrode 142 may be connected to the other of the two second areas 130b.

The planarization layer 123 may include a contact hole 125 which exposes the first driving electrode 141, and may be disposed on the first and second driving electrodes 141 and 142.

A bank 163 which separates the plurality of pixels may be disposed on the planarization layer 123. In this case, the bank 163 may be formed in the display area where the driving transistors Tdr are formed, and may include the first bank 161 which separates the pixels and the second bank 162 which separates the display area and the non-display area disposed outside the display area.

The planarization layer 123 and the bank 163 may be each formed of, for example, an organic material such as polyimide, polyamide, acryl resin, or benzo cyclo butane (BCB), but are not limited thereto. In general, such materials may have poor anti-moisture ability.

The anti-moisture unit 155 which covers the non-display area and the second bank 162 may be formed on the planarization layer 123 on which the first and second banks 161 and 162 are formed.

In this case, as illustrated in FIG. 4, the anti-moisture unit 155 may be formed to cover an entire portion of the planarization layer 123 which is exposed at the non-display area. That is, the anti-moisture unit 155 may cover all a side surface and a plane of the planarization layer 123. In other words, the anti-moisture unit 155 may cover the exposed portion of the planarization layer at the non-display area.

Moreover, as illustrated in FIG. 4, the anti-moisture unit 155 does not cover an entire portion of the second bank 162 but may cover a portion of the second bank 162 corresponding to the non-display area. That is, the second bank 162 may be formed to overlap an edge of a first electrode 147 of the OLED E, and in this case, the anti-moisture unit 155 may not be formed on a portion of the second bank 162 overlapping the edge of the first electrode 147.

Moreover, the anti-moisture unit 155 may be formed of an inorganic thin layer.

The OLED E which emits light by the driving transistor Tdr formed in each of the plurality of pixels may include the first electrode 147, an organic emission layer 148, and a second electrode 149. Here, the first electrode 147 may be formed in the display area and on the planarization layer 123. In this case, the first electrode 147 may be electrically connected to the first driving electrode 141 of the driving transistor Tdr in each of a plurality of pixel areas. The organic emission layer 148 may be formed on the first electrode 147. The second electrode 149 may be formed on the organic emission layer 148 and the bank 163.

The passivation layer 150 may be formed on the anti-moisture unit 155 and the OLEDs E.

The passivation layer 150 formed on the anti-moisture unit 155 may include a first passivation layer 151, which is formed on the anti-moisture unit 155, and one or more layers which are formed on the first passivation layer 151. The first passivation layer 151 may be formed of the same material as that of the anti-moisture unit 155, but is not limited thereto.

When the anti-moisture unit 155 is formed of the same material as that of the first passivation layer 151, adhesiveness between interfaces is better than a case where the anti-moisture unit 155 and the first passivation layer 151 are formed of different materials.

In an exemplary embodiment, the passivation layer 150 including two layers (for example, the first passivation layer 151 and a second passivation layer 152) is described as an example of the present disclosure. The second substrate 170, which is opposite to the first substrate 120 and covers the passivation layer 150, may be provided on the passivation layer 150. The second passivation layer 152 may include an organic layer, which is formed on the first passivation layer 151, and an inorganic layer which is formed on the organic layer. Also, the second passivation layer 152 may include three or more layers which include organic and inorganic layers.

As described above, the planarization layer 123 and the second bank 162, which are exposed at the non-display area, are protected by the anti-moisture unit 155, and thus, moisture permeation from the outside into the organic emission layer 148 of the OLED E, which is formed in the display area, through the planarization layer 123 or the second bank 162 is suppressed.

Moreover, the gate driver 200 including a transistor (for example, a driving transistor) covered by the planarization layer 123 may be provided in the non-display area. In this case, the gate driver 200 is protected by the anti-moisture unit 155.

In the non-display area, the gate driver 200 may be provided in a GIP type, and in addition, various elements may be provided. A plurality of thin film transistors may be provided in the gate driver 200 and the various elements. In this case, the gate driver 200 and the various elements may be covered by the planarization layer 123. Since the planarization layer 123 is protected by the anti-moisture unit 155, the gate driver 200 and the various elements are also protected by the anti-moisture unit 155. Therefore, moisture is suppressed from permeating into the gate driver 200 and the various elements, and thus, the lifetimes of the gate driver 200 and the various elements can be extended. Accordingly, the gate driver 200 and the various elements may be normally driven.

FIGS. 5A to 5F are exemplary diagrams for describing a method of manufacturing an organic light emitting display panel according to an exemplary embodiment of the present disclosure, and particularly, illustrate cross-sectional surfaces of the organic light emitting display panel in respective operations of the method of manufacturing the organic light emitting display panel according to an exemplary embodiment of the present disclosure.

Referring to FIGS. 5A to 5F, the method of manufacturing the organic light emitting display panel according to an exemplary embodiment of the present disclosure includes: forming the driving transistors Tdr on the first substrate 120; forming the planarization layer 123 which covers the driving transistors Tdr; forming the first bank 161, which is formed on the planarization layer 123 and in the display area where the driving transistors Tdr are formed and separates the plurality of pixels, and the second bank 162 which is formed on the planarization layer 123 and separates the display area and the non-display area which is disposed outside the display area; forming the anti-moisture unit 155 on the planarization layer 123 to cover the non-display area and the second bank 162; forming the plurality of OLEDs E which are respectively disposed in the plurality of pixels in the display area and emit light by the respective driving transistors Tdr; and forming a passivation layer 150, which is disposed on the anti-moisture unit 155 and the OLEDs E, and the second substrate 170 which covers the passivation layer 150.

Figure 5A:
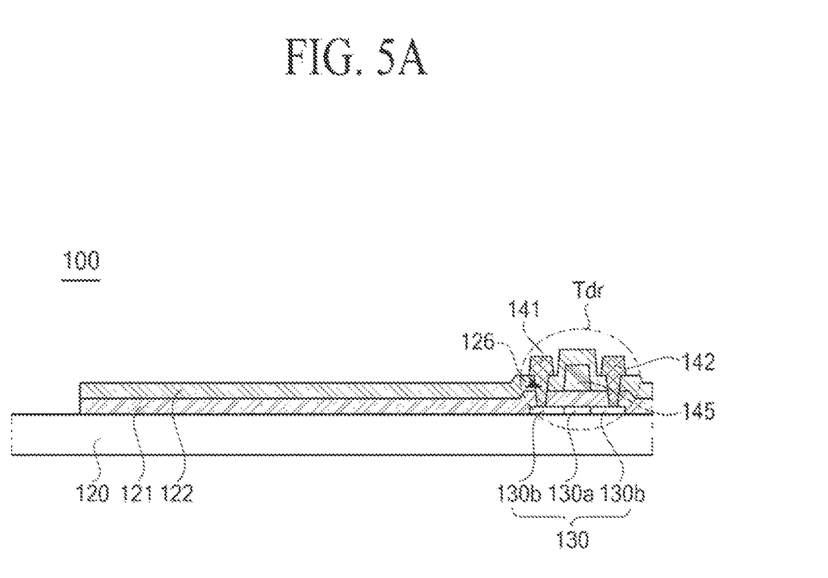
FIGS. 5A to 5F are exemplary diagrams for describing a method of manufacturing an organic light emitting display panel according to an exemplary embodiment of the present invention.

Referring to FIG. 5A, the driving transistors Tdr respectively configuring the pixels may be formed on the first substrate 120. First, amorphous silicon or oxide semiconductor layer may be deposited on the first substrate 120. The amorphous silicon may be crystallized into polysilicon by irradiating a laser beam or performing thermal treatment. The semiconductor layer 130 may be formed by patterning the polysilicon.

Subsequently, the gate insulation layer 121 may be formed on the semiconductor layer 130 formed of the polysilicon. An inorganic insulating material such as oxide silicon ($SiO_2$) may be used as the gate insulation layer 121.

The gate 145 may be formed on the gate insulation layer 121. The gate 145 may be formed of a low-resistance metal material, for example, aluminum (Al), AlNd, copper (Cu), or a copper alloy. The gate 145 may be formed at a center portion of the semiconductor layer 130. The gate insulation layer 145 may be formed between the gate 145 and the semiconductor layer 130.

Subsequently, impurities (e.g., a triadic element or a pentad element) may be doped all over the first substrate 120. In this case, the gate 145 may be used as a blocking mask. Therefore, the impurities are prevented from being doped on a center area of the semiconductor layer 130 blocked by the gate 145. An area on which the impurities are not doped may be referred to as the first area 130a. The first area 130a may be formed of pure polysilicon. Also, except the first area 130a, an outer area of the semiconductor layer 130 on which the impurities are doped may be referred to as the second area 130b.

Finally, the interlayer dielectric 122 may be formed all over the first substrate 120 where the semiconductor layer 130 divided into the first and second areas 130a and 130b is formed. Subsequently, the interlayer dielectric 122 and the gate insulation layer 121 may be patterned simultaneously or in batches. At this time, an insulation layer contact hole 126 may be formed to expose the second area 130b.

The first driving electrode 141 and the second driving electrode 142, which contact the second area 130b through the insulation layer contact hole 126, may be formed on the interlayer dielectric 122.

Figure 5B:
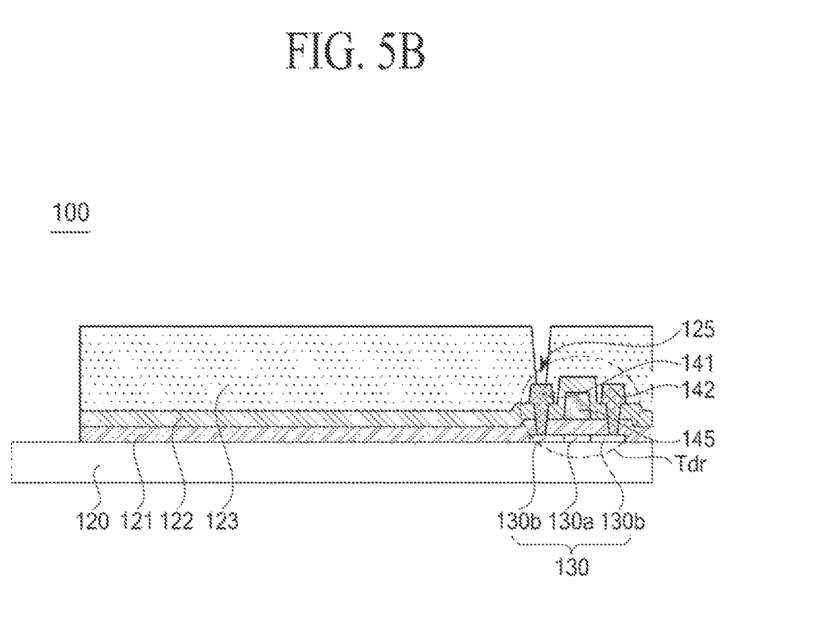

Referring to FIG. 5B, the planarization layer 123 may be formed on the driving transistor Tdr. In this case, a contact hole 125 which exposes the first driving electrode 141 of the driving transistor Tdr may be provided on the planarization layer 123. The planarization layer 123 may be formed of, for example, an organic material such as polyimide, polyamide, acryl resin, BCB, or phenol resin. However, the present exemplary embodiment is not limited thereto.

Figure 5C:
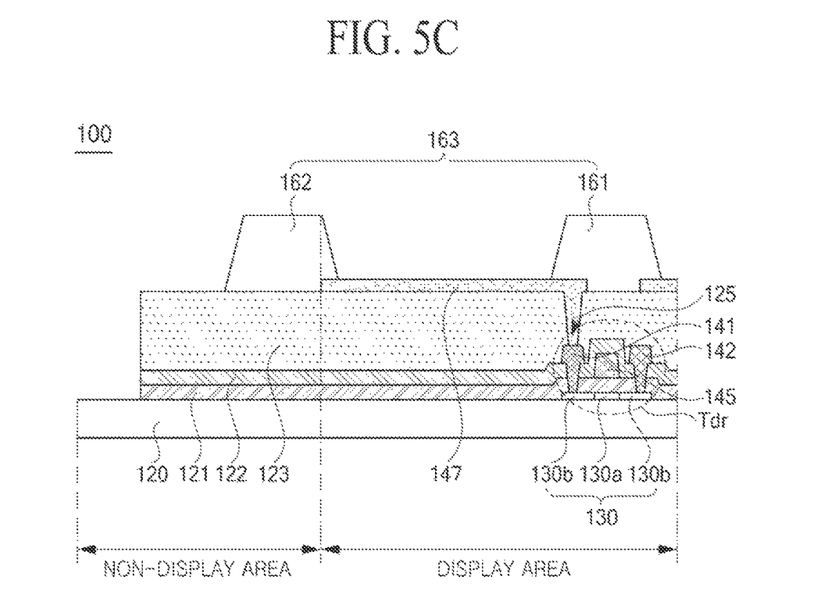

Referring to FIG. 5C, a first electrode 147 connected to the first driving electrode 141 may be formed on the planarization layer 123.

The first electrode 147 may act as an anode or a cathode depending on the type of the driving transistor Tdr. In FIG. 5C, the first electrode 147 may act as the anode of the OLED E and may be formed of a transparent conductive material (for example, indium-tin-oxide (ITO) or indium-zinc-oxide (IZO)) of which a work function value is large.

The first electrode 147 may be formed in all the pixels in common and may be patterned through a mask process.

The bank 163 may be formed on the first electrode 147. As illustrated in FIG. 5C, the bank 163 may be formed to surround each of the pixels and overlap an edge of the first electrode 147.

In this case, the bank 163 may include the first bank 161, which is formed on the planarization layer 123 and in the display area where the driving transistors Tdr are formed and divides the plurality of pixels, and the second bank 162 which is formed on the planarization layer 123 and separates the display area and the non-display area disposed outside the display area. In this case, the bank 163 may be formed of the same material as that of the planarization layer 123.

Figure 5D:
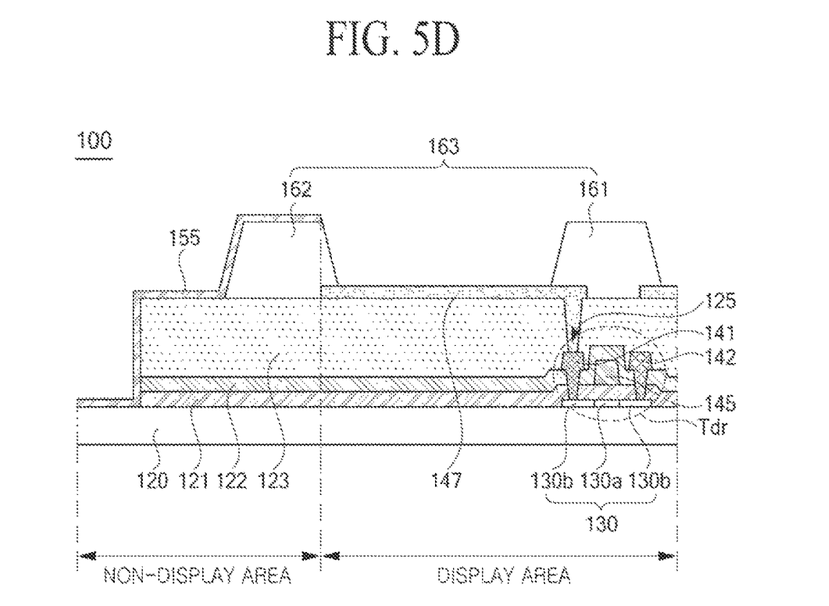

Referring to FIG. 5D, the anti-moisture unit 155 which covers the non-display area and the second bank 162 may be formed on the planarization layer 123 on which the first bank 161 and the second bank 162 are formed. In this case, the anti-moisture unit 155 may cover all the side surface and plane of the planarization layer 123.

Moreover, as illustrated in FIG. 5D, the anti-moisture unit 155 may not cover an entire portion of the second bank 162 but may cover a portion of the second bank 162 corresponding to the non-display area. That is, the second bank 162 may be formed to overlap an edge of a first electrode 147 of the OLED E, and in this case, the anti-moisture unit 155 may not be formed on a portion of the second bank 162 overlapping the edge of the first electrode 147. As described above, the anti-moisture unit 155 may be formed to be separated from, by a certain distance, the organic emission layer 148 of the OLED E which is formed later. Therefore, moisture is blocked without affecting an emission area of the OLED E.

In this case, the anti-moisture unit 155 may be formed of an inorganic thin layer.

Figure 5E:
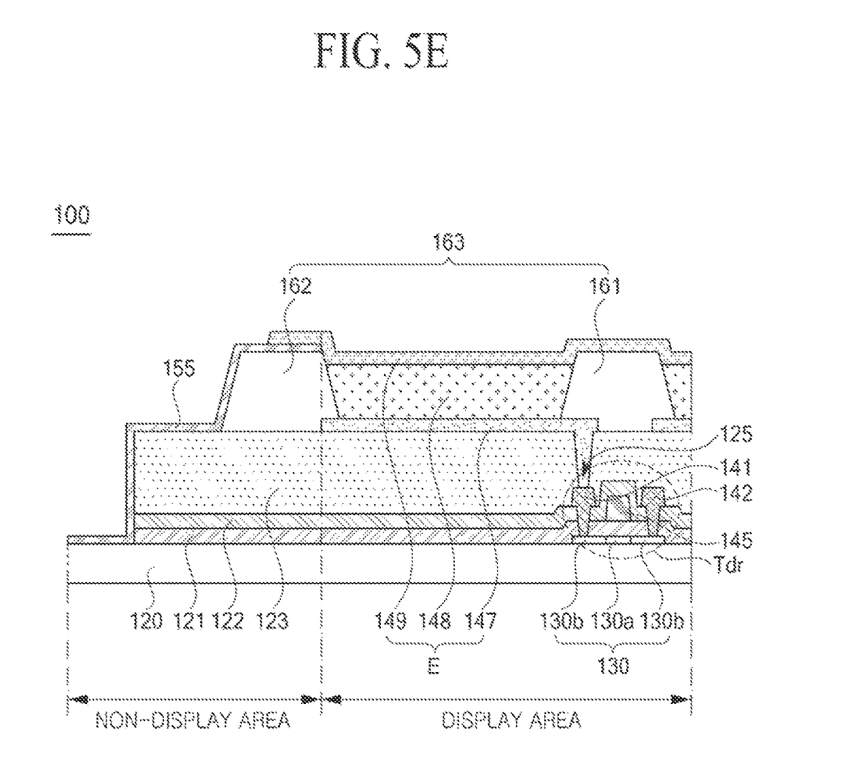

Referring to FIG. 5E, the organic emission layer 148 may be formed on the first electrode 147, and the second electrode 149 may be formed on the organic emission layer 148 and the bank 163.

The organic emission layer 148 may be formed to have a structure of a hole transport layer/emission layer/electron transport layer or a structure of a hole injection layer/hole transport layer/emission layer/electron transport layer/electron injection layer. Furthermore, the organic emission layer 148 may further include a function layer for enhancing emission efficiency and/or a lifetime of the organic emission layer 148.

The second electrode 149 formed on the organic emission layer 148 may act as a cathode electrode when the first electrode 147 acts as an anode electrode.

In this case, as illustrated in FIG. 5E, the second electrode 149 may be formed to overlap an edge of the anti-moisture unit 155. That is, the anti-moisture unit 155 may overlap an outermost portion of the second electrode 149 of the OLED E. As described above, moisture is more effectively blocked by minimizing an interval between the anti-moisture unit 155 and the second electrode 149. For example, the second electrode 149 may be formed to overlap an upper end of the anti-moisture unit 155, and thus, the permeation of moisture is more effectively prevented. The anti-moisture unit 155 is good in adhesiveness to the second bank 162 and the second electrode (a cathode) 149.

Moreover, the anti-moisture unit 155 may be separated from the organic emission layer 148 of the OLED E by a certain distance. Accordingly, moisture is blocked without affecting the emission area of the OLED E.

The OLED E may include the first electrode 147, the organic emission layer 148, and the second electrode 149. The OLED E may emit light by the driving transistor Tdr which is formed in each of the pixels.

Figure 5F:
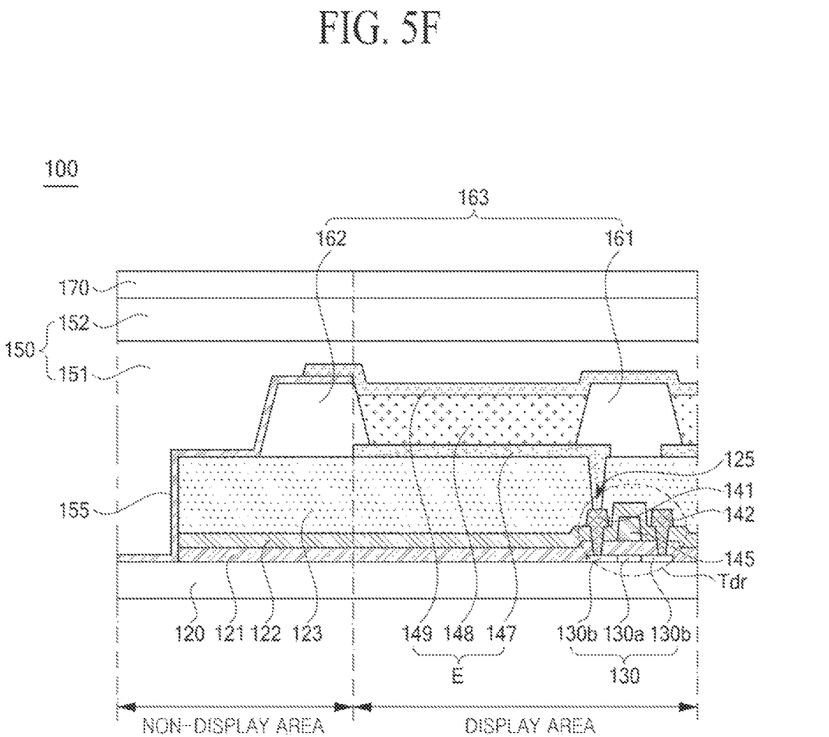

Referring to FIG. 5F, the passivation layer 150 may be formed on the anti-moisture unit 155 and the OLED E, and the second substrate 170 may be provided on the passivation layer 150.

The passivation layer 150 formed on the anti-moisture unit 155 may include one or more layers including the first passivation layer 151. In an exemplary embodiment, the passivation layer 150 including two layers (for example, the first passivation layer 151 and the second passivation layer 152) is described as an example of the present disclosure.

The first passivation layer 151 may be formed on the anti-moisture unit 155 and the OLED E. The first passivation layer 151 may be formed of the same material as that of the anti-moisture unit 155. The second passivation layer 152 may be formed on the first passivation layer 151. The second substrate 170, which is opposite to the first substrate 120 and covers the passivation layer 150, may be provided on the passivation layer 150. In this case, the second substrate 170 may be provided in a film and thin film encapsulation type. That is, the second substrate 170 may be adhered to the second passivation layer 152 in a film type, and in this case, the second substrate 170 may be deposited as a thin layer and may be formed on the second passivation layer 152.

The passivation layer 150 and the second substrate 170 protect the OLEDs E and the transistors (for example, the driving transistors) from an external impact.

In this case, the anti-moisture unit 155 protects the OLEDs E and the transistors (for example, the driving transistors) from moisture which permeates from an outermost portion of the planarization layer 123 and the second bank 162.

Moreover, since the anti-moisture unit 155 is formed, a plurality of lines which are formed in an outermost area of the organic light emitting display panel are protected.

Hereinabove, the anti-moisture unit may be applied to all organic light emitting display apparatuses which are driven in a top emission type or a bottom emission type.

Moreover, in a thin film transistor, the anti-moisture unit may be applied to a top gate type and a bottom gate type.

Moreover, the anti-moisture unit may be applied to all thin film transistor substrates using amorphous silicon, polysilicon, oxide, an organic material, etc.

Moreover, one or more features of the present invention may be applied to general organic light emitting display apparatuses, and particularly, may be applied to organic light emitting display apparatuses where a narrow bezel is realized.

As described above, according to the exemplary embodiments of the present invention, since the anti-moisture unit can be formed on the planarization layer to cover the non-display area and the second bank, moisture is prevented from penetrating into an OLED through the bank (i.e., the second bank) and the planarization layer which are disposed at an outermost portion of the organic light emitting display panel.

Moreover, according to the exemplary embodiments of the present invention, an organic light emitting display apparatus including a stable narrow bezel can be implemented.

Moreover, according to the exemplary embodiments of the present invention, the plurality of lines which are disposed at the outermost portion of the organic light emitting display panel can be protected.

Moreover, according to the exemplary embodiments of the present invention, since the anti-moisture unit can be provided, the lifetime of the organic light emitting display panel extends.

The exemplary embodiments of the present invention can also be described as follows: an apparatus comprising a first electrode on a planarization layer, an organic emission layer on the first electrode, a first bank and a second bank on the planarization layer and configured to surround the organic emission layer and an anti-moisture unit on a portion of the planarization layer and on a portion of the second bank, wherein the anti-moisture unit is configured to suppress moisture permeation through the second bank and the planarization layer. A second electrode on the organic emission layer, the first bank, the second bank and a portion of the anti-moisture unit, wherein the second electrode is configured to seal the organic emission layer with an overlapping portion of the anti-moisture unit with the second electrode.

According to one or more examples of the invention, a first portion of the second bank is covered with the anti-moisture unit, a second portion of the second bank is covered with the second electrode, and a third portion of the second bank is covered with the organic emission layer. The first bank is at a display area and the second bank is at a non-display area. The anti-moisture unit is configured to cover a side surface and a plane of the planarization layer exposed at the non-display area. The anti-moisture unit is formed of an inorganic material, wherein the planarization layer, the first bank and the second bank are formed of an organic material. A gate driver at the non-display area, wherein the gate driver is a gate-in-panel type and the planarization layer is extended to cover the gate driver. A passivation layer on the anti-moisture unit and on the second electrode. The passivation layer comprises at least one passivation layer, wherein a first passivation layer among the at least one passivation layer is formed of the same material as that of the anti-moisture unit, wherein the first passivation layer is directly contacting the anti-moisture unit.

According to one or more examples of the invention, an organic light emitting display panel can include a planarization layer configured to cover a plurality of driving transistors, a first bank on the planarization layer and in a display area having the plurality of driving transistors, and configured to separate a plurality of pixels, a second bank on the planarization layer and configured to separate the display area and a non-display area, an anti-moisture unit on the planarization layer and covering the non-display area and the second bank and a plurality of organic light emitting diodes (OLEDs) respectively in the plurality of pixels.

According to one or more examples of the invention, the anti-moisture unit can be formed of an inorganic thin layer. A passivation layer, wherein the passivation layer on the anti-moisture unit comprises a first passivation layer on the anti-moisture unit and one or more layers on the first passivation layer, and the first passivation layer is of the same material as a material of the anti-moisture unit. The anti-moisture unit covers a side surface and a plane of the planarization layer exposed at the non-display area. The gate driver including a plurality of transistors covered by the planarization layer is provided in the non-display area and is protected by the anti-moisture unit. The anti-moisture unit covers a region of the second bank corresponding to the non-display area and overlaps a cathode of the OLEDs.

It will be apparent to those skilled in the art that various modifications and variations can be made in the present disclosure without departing from the scope of the present disclosure. Thus, it is intended that the present disclosure covers the modifications and variations of this disclosure provided they come within the scope of the appended claims and their equivalents.

What is claimed is:

1. An apparatus comprising:
a first electrode on a planarization layer disposed in a display area including a plurality of pixels, the planarization layer including a portion protruded into a non-display area disposed outside the display area;
a first bank separating the plurality of pixels in the display area, the first bank disposed only in the display area;
a second bank on the protruded portion of the planarization layer at a border of the display area and the non-display area;
an anti-moisture layer disposed only in the non-display area, the anti-moisture layer covering side and upper surfaces of a first portion of the second bank corresponding to the non-display area and side and upper surfaces of the protruded portion of the planarization layer in the non-display area; and
a second electrode on an organic emission layer, the first bank, the second bank and a portion of the anti-moisture layer, the second electrode covering an upper surface of the portion of the anti-moisture layer corresponding to the first portion of the second bank,
wherein the anti-moisture layer is disposed between the second electrode and the second bank, and
wherein the anti-moisture layer contacts a lower surface of the second electrode, the side and upper surfaces of the first portion of the second bank, and the side and upper surfaces of the protruded portion of the planarization layer.

2. The apparatus of claim 1, wherein the second electrode is configured to seal the organic emission layer with an overlapping portion of the anti-moisture layer with the second electrode, and
wherein a second portion of the second bank at the display area is covered with the second electrode.

3. The apparatus of claim 1, wherein the planarization layer, the first bank and the second bank are formed of an organic material.

4. The apparatus of claim 1, further comprising:
a gate driver at the non-display area,
wherein the gate driver is a gate-in-panel type and the planarization layer covers the gate driver.

5. The apparatus of claim 1, further comprising:
a passivation layer on the anti-moisture layer and on the second electrode.

6. The apparatus of claim 1, wherein the anti-moisture layer made of an inorganic thin layer is configured to cover an extended portion into the non-display area of the planarization layer made of an organic material.

7. The apparatus of claim 4, wherein the gate driver is covered by an extended portion of the planarization layer.

8. The apparatus of claim 5, wherein the passivation layer directly contacts the anti-moisture layer.

9. The apparatus of claim 5, wherein the passivation layer is made of a same material of the anti-moisture layer.

10. The apparatus of claim 1, wherein the anti-moisture layer includes at least two stepped portions.

11. An apparatus comprising:
a first substrate including a display area and a non-display area disposed outside the display area;
a plurality of pixels including a plurality of transistors and a plurality of organic light emitting diodes including a first electrode, an organic emission layer and a second electrode stacked in sequence on the first substrate in the display area;
a planarization layer including a portion protruded into the non-display area and interposed between the plurality of transistors and the plurality of organic light emitting diodes;
a gate insulation layer of the plurality of transistors including a portion protruded into the non-display area and interposed between the planarization layer and the first substrate;
a first bank in the display area and a second bank in the non-display area, the first and second banks disposed on the planarization layer and configured to surround the organic emission layer, the first bank disposed only in the display area;
an anti-moisture layer disposed only in the non-display area, the anti-moisture layer covering side and upper surfaces of a portion of the second bank corresponding to the non-display area and side and upper surfaces of the protruded portion of the planarization layer in the non-display area;
a passivation layer on the anti-moisture layer; and
a second substrate being opposite to the first substrate and disposed on the passivation layer,
wherein the anti-moisture layer is disposed between the second electrode and the second bank, and
wherein the anti-moisture layer contacts a lower surface of the second electrode, the side and upper surfaces of the portion of the second bank, the side and upper surfaces of the protruded portion of the planarization layer, a side surface of the gate insulation layer and an upper surface of the first substrate.

12. The apparatus according to claim 11, wherein the protruded portion of the gate insulation layer includes the side surface covered by the anti-moisture layer.

13. The apparatus according to claim 11, wherein the first substrate is extended from edges of the protruded portion of the planarization layer and the gate insulation layer, and the anti-moisture layer is configured to be in contact with a protruded portion of the substrate.

14. The apparatus according to claim 11, wherein the planarization layer and the second bank are formed of organic material and the anti-moisture layer is made of inorganic thin layer such that anti-moisture ability of the anti-moisture layer is superior to the anti-moisture ability of both the planarization layer and the second bank.

15. The apparatus according to claim 11, wherein the anti-moisture layer includes at least two stepped portions.

16. An apparatus comprising:
an array of thin-film transistors (TFTs) that drive organic light emitting elements including a first electrode and a second electrode at a display area of a substrate including an interlayer dielectric, the interlayer dielectric protruding into a non-display area of the substrate surrounding the display area;
a planarization layer covering the array of TFTs in the display area and including a portion protruded into the non-display area;
a first bank disposed only in the display area to divide a plurality of pixels;
a second bank on the planarization layer at a boundary between the non-display area and the display area;
an anti-moisture layer disposed only in the non-display area, the anti-moisture layer covering side and upper surfaces of a portion of the second bank corresponding to the non-display area and side and upper surfaces of the protruded portion of the planarization layer in the non-display area to reduce moisture permeation through the second bank and the protruded portion of planarization layer in the non-display area;
a passivation layer on the anti-moisture layer, the passivation layer covering an upper surface of the anti-moisture layer and the second bank in the non-display area, and an upper surface of the first bank in the display area;
an organic layer on the passivation layer; and
an inorganic layer on the organic layer,
wherein the anti-moisture layer is formed of an inorganic material and the passivation layer is formed of a same material of the anti-moisture layer,
wherein the anti-moisture layer is disposed between the second electrode and the second bank, and
wherein the anti-moisture layer contacts a lower surface of the second electrode, the side and upper surfaces of the portion of the second bank, and the side and upper surfaces of the protruded portion of the planarization layer, a side surface of the interlayer dielectric, and a lower surface of the passivation layer.

17. The apparatus of claim 16, wherein the anti-moisture layer extends from the upper surface of the second bank and down along an external side of the second bank.

18. The apparatus of claim 16, wherein the anti-moisture layer further extends from the side surface of the interlayer dielectric that protrudes into the non-display area and is in direct contact with the substrate in the non-display area.

19. The apparatus of claim 18, wherein a material of the anti-moisture layer exhibits inorganic characteristics.

20. The apparatus of claim 16, wherein the anti-moisture layer includes at least two stepped portions.

\* \* \* \* \*